United States Patent
Pigeon

(10) Patent No.: US 10,663,503 B2
(45) Date of Patent: May 26, 2020

(54) METHODS AND DEVICES FOR DETERMINING A PHASE TO WHICH A RECEIVER DEVICE IS CONNECTED IN A POLYPHASE ELECTRIC POWER SUPPLY SYSTEM

(71) Applicant: SAGEMCOM ENERGY & TELECOM SAS, Rueil-Malmaison (FR)

(72) Inventor: Nicolas Pigeon, Rueil-Malmaison (FR)

(73) Assignee: SAGEMCOM ENERGY & TELECOM SAS, Rueil Malmaison (FR)

( * ) Notice: Subject to any disclaimer, the term of this patent is extended or adjusted under 35 U.S.C. 154(b) by 80 days.

(21) Appl. No.: 14/654,680

(22) PCT Filed: Jan. 23, 2013

(86) PCT No.: PCT/IB2013/000316
§ 371 (c)(1),
(2) Date: Jun. 23, 2015

(87) PCT Pub. No.: WO2014/096911
PCT Pub. Date: Jun. 26, 2014

(65) Prior Publication Data
US 2015/0323582 A1    Nov. 12, 2015

Related U.S. Application Data

(63) Continuation of application No. PCT/IB2012/002929, filed on Dec. 21, 2012.

(51) Int. Cl.
*G01R 29/18*    (2006.01)
*H04B 3/54*    (2006.01)
*G01R 31/40*    (2020.01)

(52) U.S. Cl.
CPC ............. *G01R 29/18* (2013.01); *G01R 31/40* (2013.01); *H04B 3/54* (2013.01); *H04B 3/542* (2013.01);
(Continued)

(58) Field of Classification Search
CPC .......... G01R 29/18; G01R 31/40; H04B 3/54; H04B 3/542; H04B 2203/5466; H04B 2203/542
See application file for complete search history.

(56) References Cited

U.S. PATENT DOCUMENTS

| | | | | |
|---|---|---|---|---|
| 4,547,733 A | * | 10/1985 | Thoraval | G01V 3/30 324/338 |
| 2007/0025391 A1 | * | 2/2007 | Yonge, III | H04B 3/54 370/458 |

(Continued)

FOREIGN PATENT DOCUMENTS

EP    2388600    11/2011

OTHER PUBLICATIONS

International Search Report, dated Aug. 28, 2013.
(Continued)

*Primary Examiner* — Akm Zakaria
(74) *Attorney, Agent, or Firm* — Greer, Burns & Crain, Ltd.

(57) ABSTRACT

A polyphase electric power supply system via which powerline communications are set up between a transmitter and a receiver. The transmitter: detects a first zero-crossing of an alternating electrical signal on a phase connected to the transmitter; determines a first instance when the transmitter is expected to transmit a dataset; determines a first time difference between the first zero-crossing and the first instance; includes in the data set information of the phase to which the transmitter is connected, when the first time (Continued)

difference is below a predefined threshold. The receiver: detects a second zero-crossing of the alternating electrical signal on the phase connected to the receiver; detects a second instant when the receiver receives the data set; determines a second time difference between the second zero-crossing and the second instant; determines the phase connected to the receiver, from the second time difference and the transmitter phase information.

16 Claims, 5 Drawing Sheets

(52) U.S. Cl.
CPC ............... *H04B 2203/542* (2013.01); *H04B 2203/5466* (2013.01)

(56) References Cited

U.S. PATENT DOCUMENTS

| | | | |
|---|---|---|---|
| 2010/0007219 A1 | 1/2010 | De Buda et al. | |
| 2011/0285382 A1* | 11/2011 | Kolwalkar | G01R 29/18 324/76.83 |
| 2013/0101003 A1* | 4/2013 | Vedantham | H04B 3/54 375/224 |
| 2013/0325376 A1* | 12/2013 | Turicchi, Jr. | H02J 3/26 702/60 |
| 2014/0093001 A1* | 4/2014 | Baba | H04B 3/54 375/257 |

OTHER PUBLICATIONS

"IEC 61334-5-1:2001, Automatisation de la distribution à l'aide de systèmes de communication à courants porteurs—Partie 5-1: Profils des couches basses—Profil S-FSK (modulation pour saut de frequencies étalées)".

"G.9955 Annex A—G3-PLC PHY Specification for CENELEC A Band", ITU.

\* cited by examiner

METHODS AND DEVICES FOR DETERMINING A PHASE TO WHICH A RECEIVER DEVICE IS CONNECTED IN A POLYPHASE ELECTRIC POWER SUPPLY SYSTEM

CROSS-REFERENCES TO RELATED APPLICATIONS

This application is a national phase of PCT application No. PCT/IB2013/000316 filed Jan. 23, 2013, which in turn claims the benefit of the PCT patent application No. PCT/IB2012/002929 filed on Dec. 21, 2012, the entire disclosures of which are incorporated herein by way of reference.

BACKGROUND OF THE INVENTION

The present invention generally relates to identifying to which phase of a polyphase electric power supply system a device is connected.

In many countries, the exact structure of the electric power supply network is not known, especially the parts of the electric power supply network located between substations' transformers and subscribers' premises. In particular, the mains phases are not clearly identified once low-voltage cables exit the substations. It is therefore complex for an installer to determine on which phase an electricity meter is being connected. This causes numerous problems to the operator of the electric power supply network, in particular for low-voltage network supervision and load balancing at transformers.

It is therefore desirable to be able to determine to which mains phase an electricity meter, or an interface of such an electricity meter, is physically connected.

This problem also occurs in the context of polyphase electric power supply systems for devices other than electricity meters, whenever cross-phase communications may take place, since such cross-phase communications frequently require installing additional devices in order to increase reliability of the communications.

The document "*IEC 61334-5-1:2001, Automatisation de la distribution à l'aide de systèmes de communication à courants porteurs—Partie 5-1: Profils des couches basses—Profil S-FSK (modulation pour saut de frequencies étalées)*" provides a mechanism for determining the phase to which a receiver device is connected. The mechanism relies on a transmission by a transmitter device of PHY frames exactly at an instant at which an alternating electrical signal transmitted on the phase to which the transmitter device is connected performs zero-crossing. The receiver device is then able to determine the phase to which the receiver device is connected by determining the delay between zero-crossings detection by the receiver device and receptions of PHY frames. This mechanism is however not applicable in situations wherein the frame transmissions cannot be forced to occur synchronously with zero-crossings of the alternating electrical signal. Indeed, rendering asynchronous the frame transmission from the shape of the alternating signal allows increasing the communication bandwidth. For instance, this mechanism is not applicable in the context of the PRIME (PoweRline Intelligent Metering Evolution) standard or in the context of the G3-PLC specification, as defined by the ITU document "*G.9955 Annex A—G3-PLC PHY Specification for CENELEC A Band*".

Another solution, proposed in the context of the PRIME standard task force, is for the transmitter device to determine time gaps between zero-crossings of the alternating electrical signal and the transmissions of beacons, which are transmitted at fixed time intervals. Values of the determined time gaps are then transmitted by the transmitter device to the receiver device in the beacons. The receiver device is then able to determine the phase to which the receiver device is connected on the basis of the time gap values provided by the transmitter device and of the delay between zero-crossings detection by the receiver device and receptions of PHY frames. However, this solution generates significant overhead costs.

It is desirable to overcome the aforementioned problems of the prior art. In particular, it is desirable to provide a solution that allows determining the phase to which the receiver device is connected although powerline communications occur asynchronously from the shape of the alternating electrical signal, and furthermore, with limited overhead.

It is furthermore desirable to provide a solution that allows the receiver device determining whether the receiver device is connected in a phase reversal manner.

SUMMARY OF THE INVENTION

To that end, the present invention concerns a method for determining a phase to which a receiver device is connected in a polyphase electric power supply system, an alternating electrical signal being transmitted via the phases of the polyphase electric power supply system, a powerline communication being setup between a transmitter device and the receiver device via the polyphase electric power supply system. The method is such that the transmitter device performs: detecting a first zero-crossing of the alternating electrical signal on a phase to which the transmitter device is connected; determining an instant at which the transmitter device is expected to transmit a data set to the receiver device; determining a first time difference from said first zero-crossing and said instant at which the transmitter device is expected to transmit the data set; including in the data set to be transmitted information representative of the phase to which the transmitter device is connected, when said first time difference is below a first predefined threshold. The method is further such that the receiver device performs: detecting a second zero-crossing of the alternating electrical signal on the phase to which the receiver device is connected; determining an instant at which the receiver device receives the data set; determining a second time difference from said second zero-crossing and said instant at which the receiver device receives the data set; determining the phase to which the receiver device is connected, on the basis of said second time difference and of said information representative of the phase to which the transmitter device is connected.

Thus, the receiver device is able to determine the phase to which the receiver device is connected although data transmissions occur asynchronously from the shape of the alternating electrical signal, and furthermore, with limited overhead.

According to a particular feature, the alternating electrical signal being transmitted via the phases of the polyphase electric power supply system at a first frequency, the transmitter device transmitting powerline communication beacons to the receiver device at a second frequency different from the first frequency, the first and second frequencies not being multiple of each other, said data set is one said beacon.

Thus, the system benefits from the difference between the first and second frequencies, which leads to beacon transmission occurring regularly almost at the same instant as zero-crossing, in order to enable determining the phase to which the receiver device is connected.

According to a particular feature, the powerline communication is setup according to the PRIME specification.

According to a particular feature, the transmitter device transmitting powerline communication frames in a Carrier Sense Multiple Access with Collision Avoidance manner, said data set is one said frames.

Thus, the system benefits from the asynchronous characteristic of frame transmissions, which leads at some instant in time to a situation in which a frame transmission occurs almost at the same instant as zero-crossing, in order to enable determining the phase to which the receiver device is connected According to a particular feature, the powerline communication is setup according to the G3-PLC specification.

According to a particular feature, the receiver device performs: detecting whether the received data set includes information representative of the phase to which the transmitter device is connected, and determining the phase to which the receiver device is connected is performed when the receiver device detects that said information representative of the phase to which the transmitter device is connected is included in the received data set.

Thus, a single piece of information indicates the phase to which the transmitter device is connected and triggers determining by the receiver device the phase to which the receiver device is connected.

According to a particular feature, the step of including in the data set to be transmitted information representative of the phase to which the transmitter device is connected is performed at a predefined location in the data set, and, when said first time difference is not below the first predefined threshold, the transmitter device performs: including in the data set to be transmitted meaningless information at said predefined location.

Thus, legacy devices are supported thanks to the meaningless information.

According to a particular feature, the receiver device performs: determining said second time difference for plural received data sets that have information representative of the phase to which the transmitter device is connected; averaging said second time difference over said plural received data sets. The method is further such that the receiver device determines the phase to which the receiver device is connected, on the basis of the averaged second time difference and of said information representative of the phase to which the transmitter device is connected.

Thus, errors occurring when determining said second time difference can be compensated.

According to a particular feature, the receiver device performs: determining phase temporary information, representing the phase to which the receiver device is supposed to be connected, for each data set of a plurality received data sets, on the basis of said second time difference determined for said data set and of said information representative of the phase to which the transmitter device is connected being included in said data set; considering that the phase to which the receiver device is connected relates to the phase temporary information that coincides for N consecutive data sets, wherein N>1.

Thus, the confidence in the determined phase is increased.

According to a particular feature, the receiver device performs: determining phase temporary information, representing the phase to which the receiver device is supposed to be connected, for each data set of a plurality received data sets, on the basis of said second time difference determined for said data set and of said information representative of the phase to which the transmitter device is connected being included in said data set; considering that the phase to which the receiver device is connected relates to the phase temporary information represented the most among M consecutive data sets, wherein M>1.

Thus, the confidence in the determined phase is increased in another way.

According to a particular feature, the receiver device performs: determining phase temporary information, representing the phase to which the receiver device is supposed to be connected, for each data set of a plurality received data sets, on the basis of said second time difference determined for said data set and of said information representative of the phase to which the transmitter device is connected being included in said data set; inputting the phase temporary information in a low-pass filter; considering that the phase to which the receiver device is connected is a rounded output of the low-pass filter.

Thus, the confidence in the determined phase is increased in yet another way.

According to a particular feature, the polyphase electric power supply network is the electricity mains, the transmitter device is a concentrator, and the receiver device is a meter installed at premises of a subscriber.

According to a particular feature, the polyphase electric power supply system being direct, the transmitter device and the receiver device detect zero-crossing with positive slope of the alternating electrical signal and with negative slope of the electrical alternating signal, and the receiver device performs: comparing said second time difference with a set of values $V_k$ defined as follows:

$$V_k = \frac{k-1}{2F \cdot K}$$

wherein K is the number of phases, F is the frequency of the alternating electrical signal and k is an index of the phases taking the values from 1 to K. The method is further such that the receiver device performs: determining a value V among the values $V_k$ such that the absolute difference between said second time difference and said value V is below a second predefined threshold; determining the phase P to which the receiver device is connected as follows:

$$P = ([PHASE] - k(V_k)) \% K + 1$$

wherein k ($V_k$) represents the value of k corresponding to the value V and [PHASE] represents said information representative of the phase to which the transmitter device is connected, presented as an index of the phases.

Thus, the phase to which the receiver device is connected can be determined in a simple way, by simply comparing said second time difference with a set of predefined values.

According to a particular feature, the polyphase electric power supply system being direct, the transmitter device and the receiver device detect zero-crossing with positive slope of the alternating electrical signal or with negative slope of the electrical alternating signal, and the receiver device performs comparing said second time difference with a first set of values $V''_k$ and a second set of values $V'_k$ defined as follows:

$$V''_k = \frac{k-1}{F \cdot K}$$

-continued $$V'_k = \frac{k-1}{F \cdot K} + \frac{1}{2K \cdot F}$$

Wherein K is the number of phases, F is the frequency of the alternating electrical signal and k is an index of the phases taking the values from 1 to K. The method is further such that the receiver device performs: determining a value V" among the values V"$_k$ or a value V' among the values V'$_k$ such that the absolute difference between said second time difference and said value V" or respectively said value V' is below a second predefined threshold; determining the phase to which the receiver device is connected as follows, according to whether the value V" or the value V' is determined:

$P=([PHASE]+k(V''_k)+1)\% K+1$ $P=([PHASE]+k(V'_k)+3)\% K+1$ wherein k(V"$_k$) represents the value of k corresponding to the value V", k(V'$_k$) represents the value of k corresponding to the value V' and [PHASE] represents said information representative of the phase to which the transmitter device is connected, presented as an index of the phases.

Thus, the phase to which the receiver device is connected can be determined in a simple way, by simply comparing said second time difference with a set of predefined values.

According to a particular feature, the receiver device being a single-phase receiver device, when the receiver device determines a value V' among the values V'$_k$ such that the absolute difference between said second time difference and said value V' is below the second predefined threshold, the receiver device considers being connected in a phase reversal manner.

The present invention also concerns a system for determining a phase to which a receiver device is connected in a polyphase electric power supply system, the system comprising a transmitter device and the receiver device, an alternating electrical signal being transmitted via the phases of the polyphase electric power supply system, the system being adapted to setup a powerline communication between the transmitter device and the receiver device via the polyphase electric power supply system. The system is such that the transmitter device comprises: means for detecting a first zero-crossing of the alternating electrical signal on a phase to which the transmitter device is connected; means for determining an instant at which the transmitter device is expected to transmit a data set to the receiver device; means for determining a first time difference from said first zero-crossing and said instant at which the transmitter device is expected to transmit the data set; means for including in the data set to be transmitted information representative of the phase to which the transmitter device is connected, when said first time difference is below a first predefined threshold. The system is further such that the receiver device comprises: means for detecting a second zero-crossing of the alternating electrical signal on the phase to which the receiver device is connected; means for determining an instant at which the receiver device receives the data set; means for determining a second time difference from said second zero-crossing and said instant at which the receiver device receives the data set; means for determining the phase to which the receiver device is connected, on the basis of said second time difference and of said information representative of the phase to which the transmitter device is connected.

The present invention also concerns a transmitter device and a receiver device, as depicted above in the scope of the system for determining a phase to which a receiver device is connected. The present invention also concerns methods performed by the transmitter device and the receiver device, as depicted above in the scope of the system for determining a phase to which a receiver device is connected.

The present invention also concerns a computer program that can be downloaded from a communication network and/or stored on a medium that can be read by a processing device. This computer program comprises instructions for causing implementation of the aforementioned method, when said program is run by a processor. The present invention also concerns information storage means, storing a computer program comprising a set of instructions causing implementation of the aforementioned method, when the stored information is read from said information storage means and run by a processor.

a first door and a second door, each being mobile between an open position and a closed position, and
a maneuvering system comprising:
an actuation mechanism,
a first transmission chain intended to transmit the movements of the actuation mechanism to the first door,
a second transmission chain intended to transmit the movements of the actuation mechanism to the second door.

Such an aircraft is thus equipped with a single actuation mechanism which simplifies and lightens the mechanism relative to the prior art.

BRIEF DESCRIPTION OF THE DRAWINGS

The characteristics of the invention will emerge more clearly from a reading of the following description of an example of embodiment, said description being produced with reference to the accompanying drawings, among which.

DETAILED DESCRIPTION OF THE PREFERRED EMBODIMENTS

Figure 1:
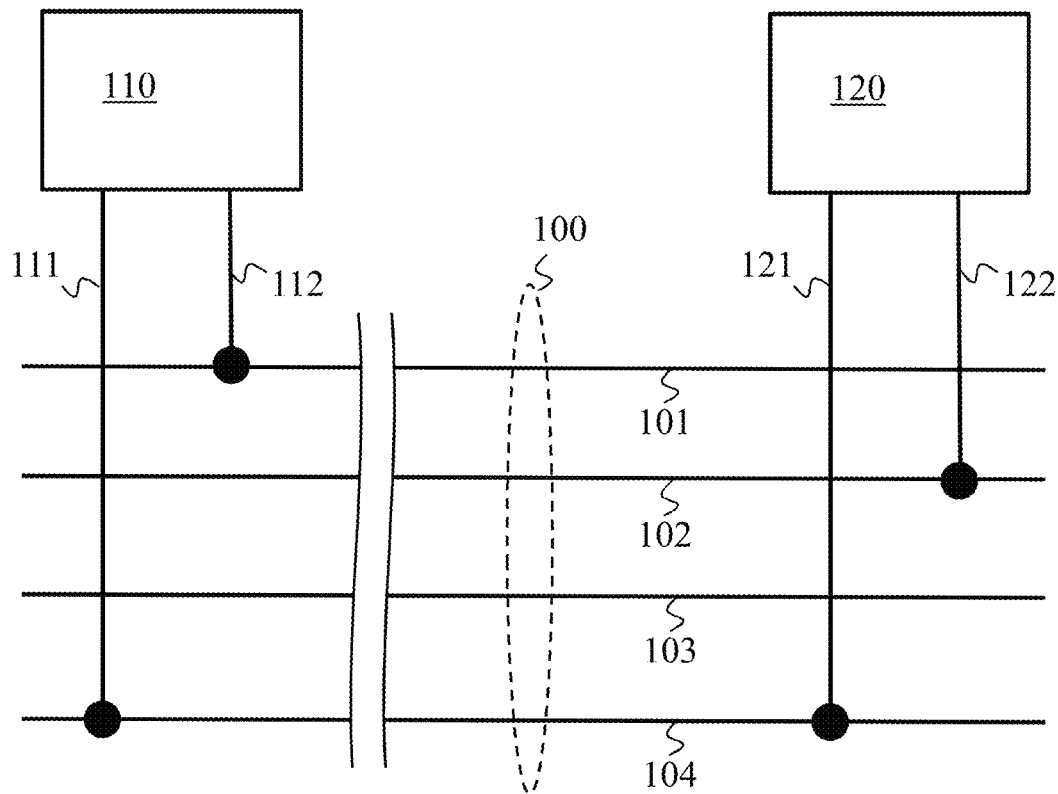
FIG. 1 is a schematic diagram of a communication system in which the present invention may be implemented.

FIG. 1 is a schematic diagram of a communication system in which the present invention may be implemented.

The communication system comprises communication devices, namely a transmitter device 110 and a receiver device 120. Powerline communications from the transmitter device 110 to the receiver device 120 rely on a polyphase electric power supply network 100. The electric power supply network 100 consists of a plurality of wires, one wire being dedicated to be neutral in the electric power supply network 100 and at least two wires being dedicated to at least two respective phases. In the illustrative example shown in FIG. 1, the electric power supply network 100 is a three-phase system and therefore consists of four wires: one wire 104 as a neutral, one wire 101 for a first phase, one wire 102 for a second phase and one wire 103 for a third phase. The phase separation is therefore 120 degrees between two phases, and would be 180 degrees in the case of a two-phase system, since in polyphase electric power supply networks the phases are equidistant in angle.

In the communication system shown in FIG. 1, the transmitter device 110 is coupled to the wire 104 dedicated to be neutral via a first connecting wire 111 and to the wire 101 dedicated to a first phase via a second connecting wire 112. Moreover, the receiver device 120 is coupled to the wire 104 dedicated to be neutral via a third connecting wire 121 and to the wire 102 dedicated to a second phase via a fourth connecting wire 122. In the communication system shown in FIG. 1, the transmitter device 110 and the receiver device 120 are therefore connected to distinct phases, although the transmitter device 110 and the receiver device 120 can be connected to a same phase.

Even though the transmitter device 110 and the receiver device 120 are connected to distinct phases, the receiver device 120 is able to receive powerline communications signals transmitted by the transmitter device 110 due to parasitic inductance and capacitance between the wires of the polyphase electric power supply network 100, such as those, for instance, installed in substations' transformers.

The phase to which the transmitter device 110 is connected is a priori known by the transmitter device 110. According to a first example, during installation of the transmitter device 110, an installer ensures that the transmitter device 110 is being connected to a predefined phase or enters information representative of the phase to which the transmitter device 110 is being connected via a user interface of the transmitter device 110. According to a second example, the transmitter device 110 is part of a transceiver device. The transceiver device may rely on transmissions performed by another transmitter device that knows the phase to which said another transmitter device is connected, and therefore the transceiver device may determine the phase to which the transceiver device is connected using the same method as described hereinafter with regard to the receiver device 120.

The phase to which the transmitter device 110 is connected is a priori unknown by the receiver device 120 and the phase to which the receiver device 120 is connected is also a priori unknown by the receiver device 120.

In the scope of the powerline communications, the transmitter device 110 is adapted to transmit data sets, such as frames and/or beacons, to the receiver device 120.

According to a first embodiment, the transmitter device 110 is adapted to transmit beacons to the receiver device 120 at a fixed frequency different from a frequency of an alternating electrical signal transmitted by the phases and that is not a multiple nor a sub-multiple of said frequency of the alternating electrical signal. The purpose of such beacons is to circulate information on a MAC (Medium Access Control) frame structure in the scope of the powerline communications and therefore channel access to communication devices that are part of the powerline communications. The beacons are expected to be transmitted at definite fixed intervals of time and are used as a synchronization mechanism at the MAC layer. The first embodiment is particularly well suited for powerline communications based on the PRIME specification.

According to a first embodiment, the transmitter device 110 is adapted to transmit frames to the receiver device 120 in a Carrier Sense Multiple Access with Collision Avoidance (CSMA-CA) manner. The second embodiment is particularly well suited for powerline communications based on the G3-PLC specification.

Figure 2:
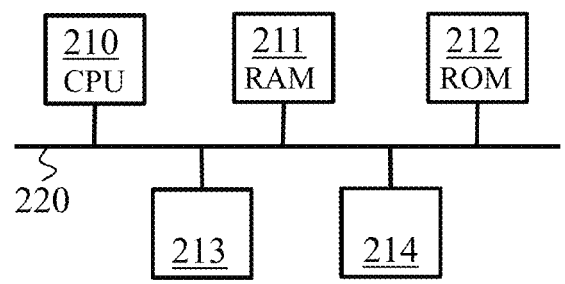
FIG. 2 is a schematic diagram representing a hardware platform of a communication device of the system of FIG. 1.

FIG. 2 is a schematic diagram representing a hardware platform of a communication device of the system of FIG. 1, in the case that said communication device is the transmitter device 110 or the receiver device 120.

The communication device comprises the following components interconnected by a communications bus 210: a processor, microprocessor, microcontroller or CPU (Central Processing Unit) 300; a RAM (Random-Access Memory) 201; a ROM (Read-Only Memory) 202; an SD (Secure Digital) card reader 203, or any other device adapted to read information stored on storage means; and an interface 204 for connecting the communication to at least one phase wire and to a neutral wire of a polyphase electrical system.

CPU 200 is capable of executing instructions loaded into RAM 201 from ROM 202 or from an external memory, such as an SD card. After the communication device has been powered on, CPU 200 is capable of reading instructions from RAM 201 and executing these instructions. The instructions form one computer program that causes CPU 200 to implement at least some of the modules described hereafter with regard to FIG. 3 or 4 and/or perform at least some of the steps of the algorithm described hereafter with regard to FIG. 5 or 6.

Figure 3:
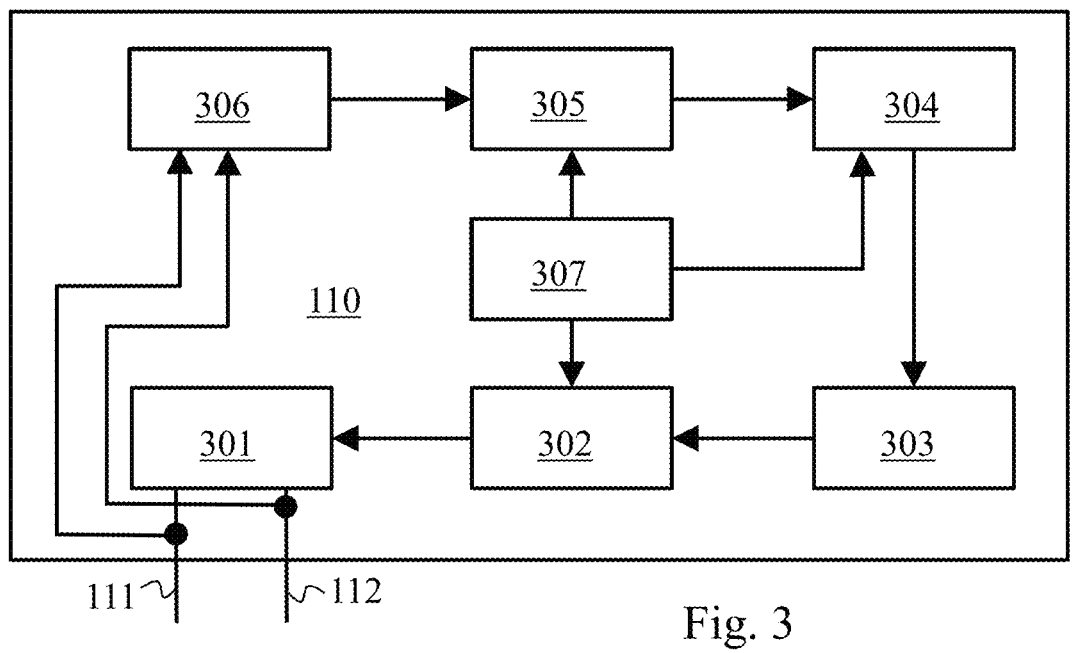
FIG. 3 is a schematic block diagram representing modules of a transmitter device of the system of FIG. 1.
Figure 4:
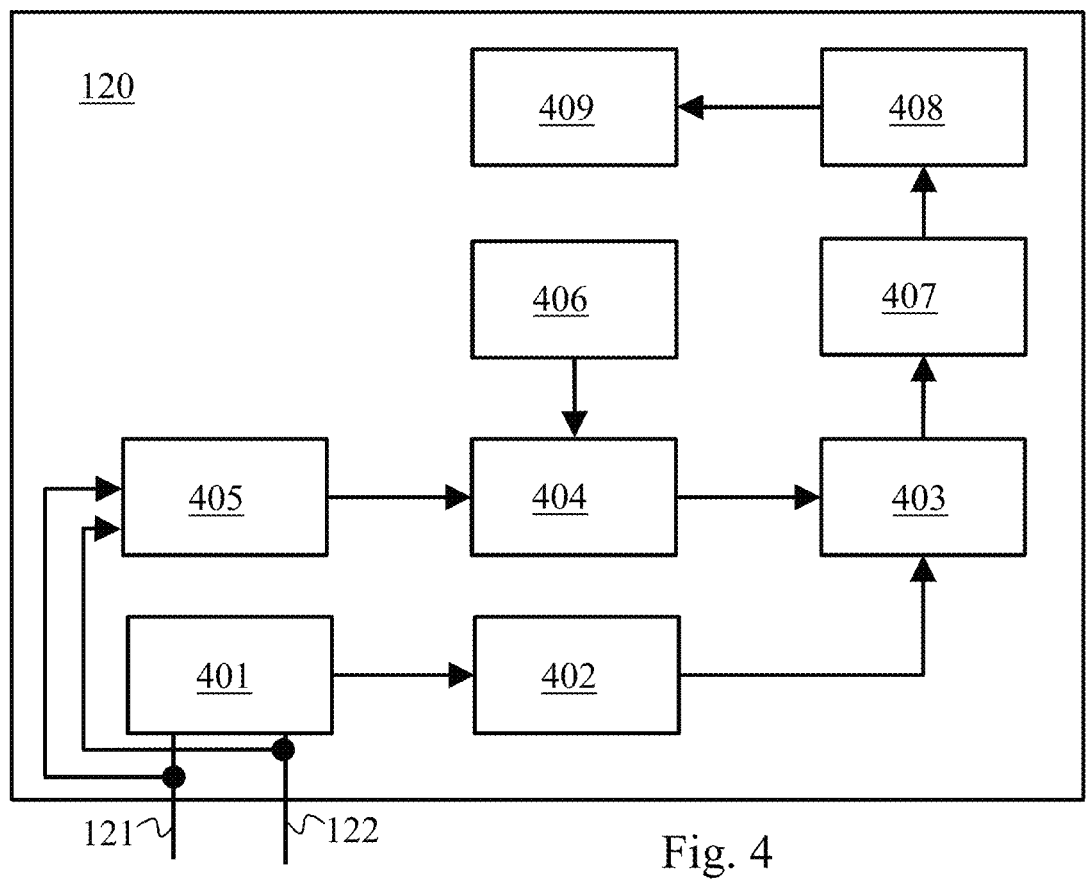
FIG. 4 is a schematic block diagram representing modules of a receiver device of the system of FIG. 1.
Figure 5:
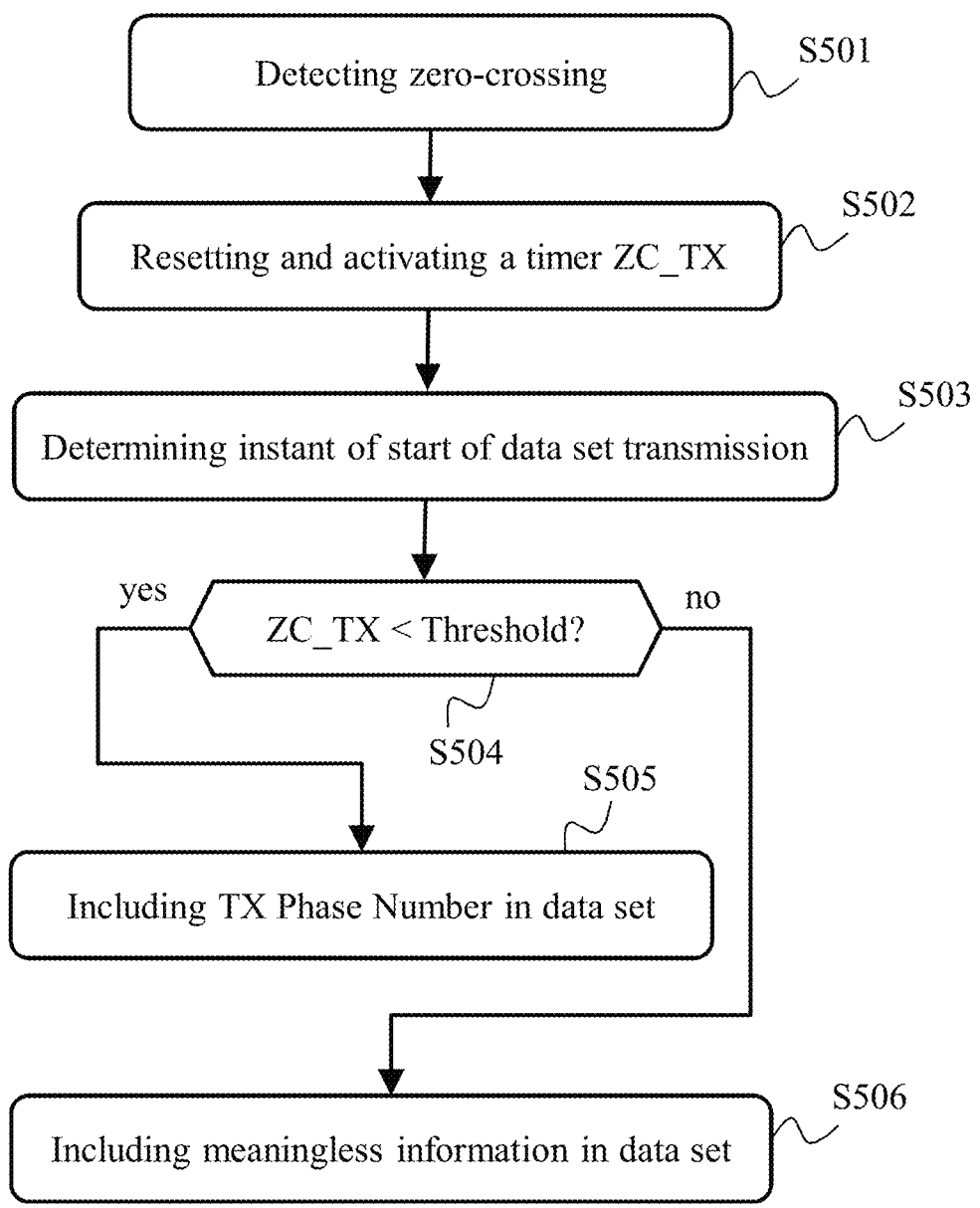
FIG. 5 is a schematic diagram representing an algorithm performed by the transmitter device.
Figure 6:
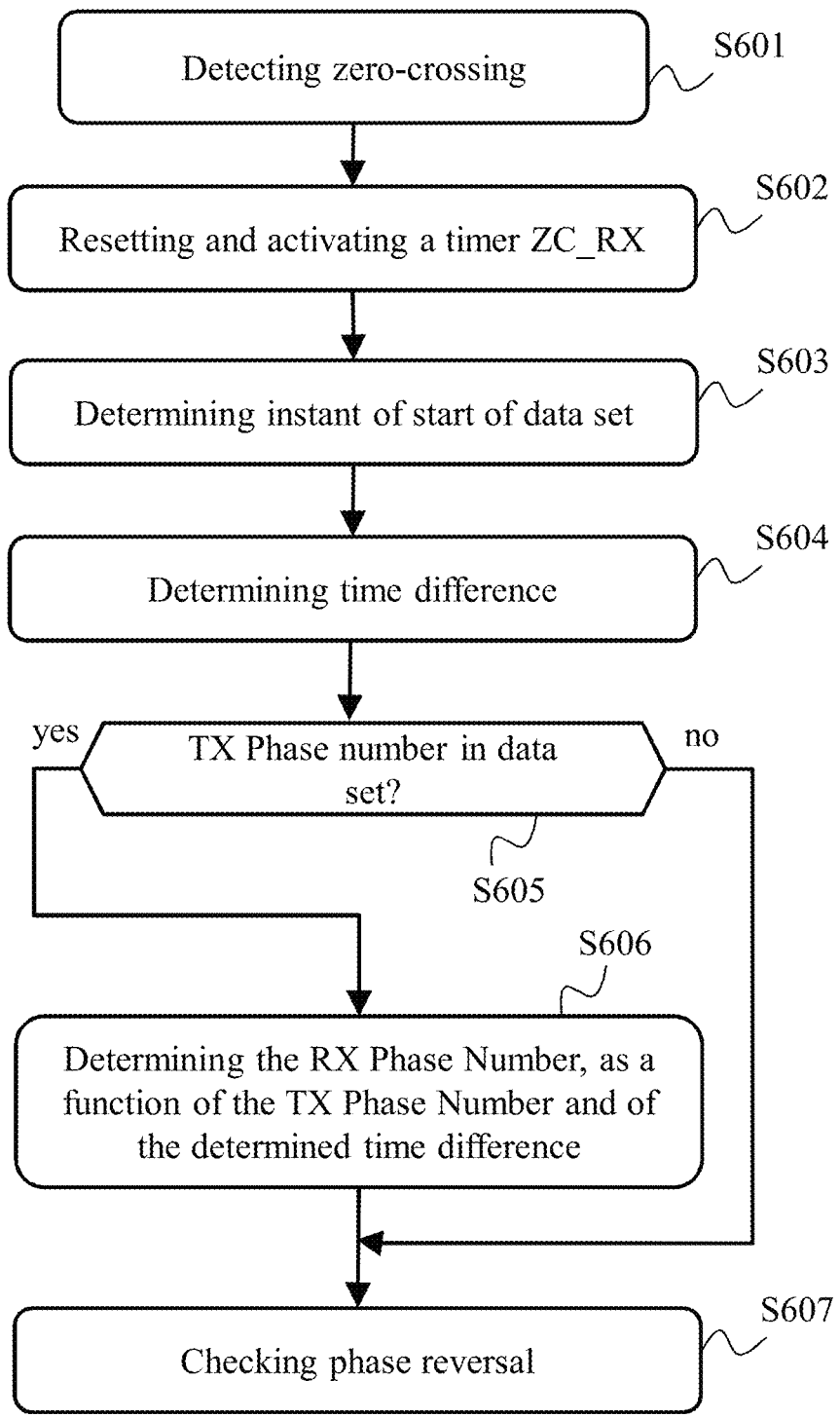
FIG. 6 is a schematic diagram representing an algorithm performed by the receiver device.

Any and all steps of the algorithms described hereafter with regard to FIGS. 5 and 6, and any and all modules described hereafter (except couplers) with regard to FIGS. 3 and 4, may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the communication device includes circuitry, or a device including circuitry, causing the communication device to implement the modules described hereafter with regard to FIG. 3 or 4 and/or perform at least some of the steps of the algorithm described hereafter with regard to FIG. 5 or 6.

FIG. 3 is a schematic block diagram representing modules of the transmitter device 110, according to one embodiment of the present invention.

The transmitter device 110 comprises a clock generator 307 adapted to provide a timing reference to a timer ZC_TX 305, to a comparator 304 and to a data set generator 302. In the first embodiment, the data set generator 302 is a beacon generator, adapted to generate beacons at a fixed frequency. In the second embodiment, the data set generator 302 is a frame generator, adapted to generate frames in a CSMA-CA manner.

The transmitter device 110 further comprises a coupler 301 aiming at connecting the transmitter device 110 to the wire 104 dedicated to the neutral and to one wire dedicated to one phase, such as the wire 101, in order to allow setting up and performing the powerline communications.

The transmitter device 110 further comprises a zero-crossing detector 306 adapted to detect each instant at which the alternating electrical signal on the phase to which the transmitter device 110 is connected crosses zero. Zero-crossing is detected when there is a change of polarity of the alternating electrical signal. The zero-crossing detector 306 is adapted to detect zero-crossing with positive slope of the alternating electrical signal and/or negative slope of the alternating electrical signal.

The transmitter device 110 further comprises the timer ZC_TX 305, having, for instance, an accuracy of 10 μs. The timer ZC_TX 305 is reset and activated by the zero-crossing detector 306 when zero-crossing is detected. The timer ZC_TX 305 provides to the comparator 304 a counter value representative of the period elapsed since the last zero-crossing detection on the phase to which the transmitter device 110 is connected.

The transmitter device 110 further comprises the comparator 304. The comparator 304 is triggered by the transmitter device 110 a predefined period before an instant at which a data set is expected to be transmitted.

The comparator 304 is adapted to determine a time difference from the instant of the last detected zero-crossing and the instant at which the transmitter device 110 is expected to transmit a data set, and to compare said time difference with a predefined threshold ZC_TH. The comparator 304 obtains said time difference from the value provided by the timer ZC_TX 305: either it is considered that the remaining time before an effective transmission of the data set is negligible, and then the comparator 304 is adapted to compare, with the predefined threshold ZC_TH, the value provided by the timer ZC_TX 305; or it is considered that the remaining time before the effective transmission of the data set is not negligible, and then the comparator 304 is adapted to compare, with the predefined threshold ZC_TH, the sum of the value provided by the timer ZC_TX 305 and the remaining time before the effective transmission of the data set. When the time difference is below the predefined threshold ZC_TH, it is considered that the data set transmission coincides with zero-crossing detection, and the comparator 304 is adapted to trigger a phase information providing module 303.

The transmitter device 110 further comprises the phase information providing module 303. When the phase information providing module 303 is not triggered by the comparator 304, the phase information providing module 303 is adapted to provide to the data set generator module 302 a meaningless value; otherwise, the phase information providing module 303 is adapted to provide to the data set generator 302 a value representative of the phase to which the transmitter device 110 is connected.

Meaningless information is a value that is not used to refer to a phase to which the transmitter device 110 can be connected. For instance, considering a three-phase system, only 2 bits are necessary to identify the three phases and four values can be coded with these 2 bits. Therefore, the binary value "00" may represent the meaningless information and the binary values "01", "10" and "11" may be used to identify each one of the three phases.

The transmitter device 110 further comprises the data set generator 302. The data set generator 302 is adapted to generate data sets in the scope of the powerline communications, said data sets including, at a predefined location PHASE, the value provided by the phase information providing module 303.

Thus, the transmitter device 110 is adapted, when a time difference from a zero-crossing on the phase to which the transmitter device 110 is connected to an instant of transmission of a data set is below a predefined threshold, to transmit at a predefined location in the data set information representative of the phase to which the transmitter device 110 is connected, and when said time difference is equal of greater than said predefined threshold, to transmit at the predefined location in the data set the meaningless information.

Figure 7:
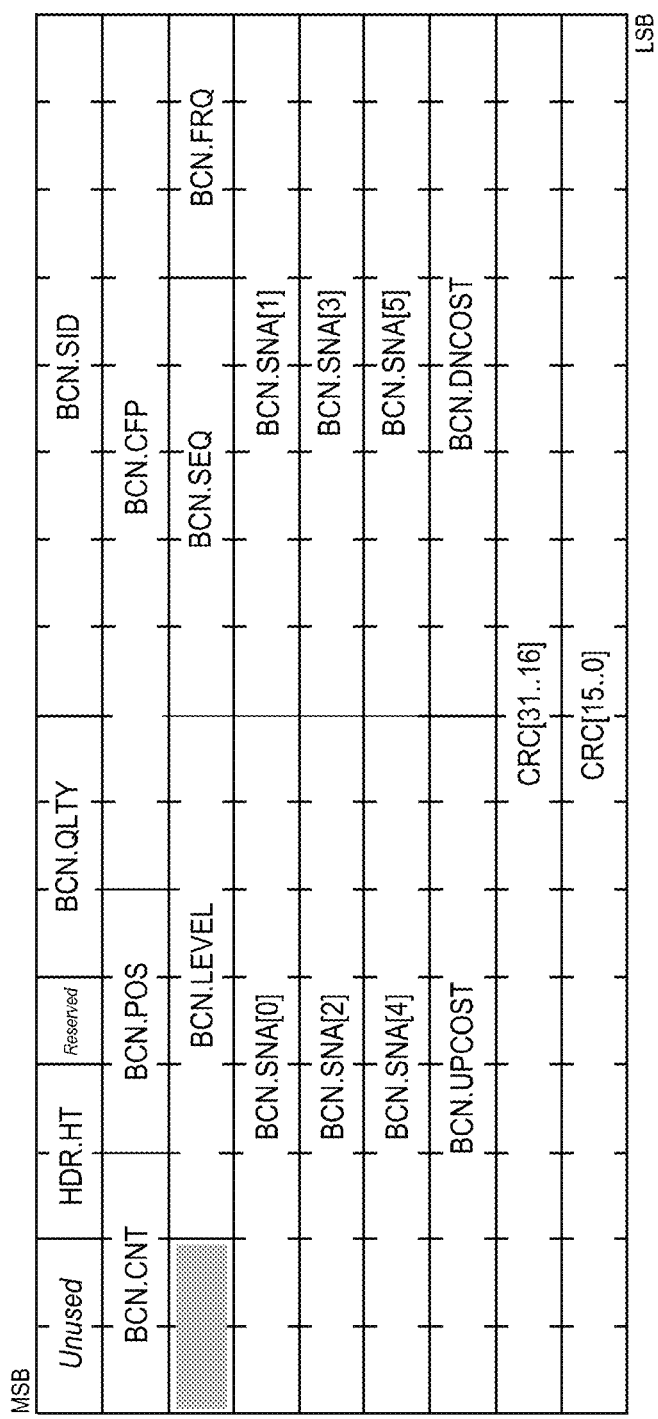
FIG. 7 is a schematic diagram representing a beacon format.

In a preferred embodiment, the polyphase electric power supply network 100 is the electricity mains, the transmitter device 110 is a concentrator and the receiver device 120 is a meter installed at premises of a subscriber. Therefore, the polyphase electric power supply network 100 is a three-phase system, and only 2 bits are necessary to identify the three phases. Let's consider a particular embodiment wherein the powerline communications are performed according to the PRIME standard, and wherein the data sets are beacons. FIG. 7 is a schematic diagram representing a beacon format according to the PRIME standard, as defined in paragraph 4.4.4 of the PRIME draft standard specification, release 1.3.6. The two most significant bits of the third 16-bit word (grayed in FIG. 7) are reserved for future use in the aforementioned PRIME standard draft specification and would therefore be a suitable place for the predefined location PHASE. Moreover, communication devices conforming to said PRIME standard draft specification are expected to include the binary value "00" at this location in the beacon format, which matches the meaningless information value as defined hereinbefore. When a legacy device confirming to the aforementioned PRIME draft specification receives a beacon including a binary value different from "00" at the predefined location PHASE, said legacy device may consider the beacon as invalid. However, said legacy device shall tolerate beacon losses, as defined by the limit Nmiss-beacon=5 defined by the aforementioned PRIME draft specification, which considers that a receiver device is not operational only after having detected Nmiss-beacon consecutive invalid beacons. It is therefore very unlikely that the phase determination mechanism described herein lead to reaching this limit, and thus, support of legacy devices is ensured.

Let's consider another particular embodiment wherein the powerline communications are performed according to the G3-PLC standard, and wherein the data sets are frames transmitted in a CSMA-CA manner. Bits of the PDC (Phase Detection Counter) field and the FCH (Frame Control Header) header may be used for the predefined location PHASE. In the case of the aforementioned preferred embodiment, only two bits are necessary. The remaining bits of the PDC field can be used for another purpose, such as increasing the transmission robustness by using these bits for CRC (Cyclic Redundancy Checksum) information.

FIG. 4 is a schematic block diagram representing modules of the receiver device 120, according to one embodiment of the present invention.

The receiver device 120 comprises a clock generator 406 adapted to provide a timing reference to a timer ZC_RX 404.

The receiver device 120 further comprises a coupler 401 configured for connecting the receiver device 120 to the wire 104 dedicated to the neutral wire and to one wire dedicated to one phase, such as the wire 102, in order to allow setting up and performing the powerline communications.

The receiver device 120 further comprises a zero-crossing detector 405 adapted to detect each instant at which the alternating electrical signal on the phase to which the receiver device 120 is connected crosses zero. Zero-crossing is detected when there is a change of polarity of the alternating electrical signal. The zero-crossing detector 405 is adapted to detect zero-crossing with positive slope of the alternating electrical signal and/or negative slope of the alternating electrical signal.

The receiver device 120 further comprises the timer ZC_RX 404, having for instance an accuracy of 10 μs. The timer ZC_RX 404 is reset and activated by the zero-crossing detector 405 when zero-crossing is detected. The timer ZC_RX 404 provides to a time difference computing module 403 a counter value representative of the period elapsed since the last zero-crossing detection on the phase to which the receiver device 120 is connected.

The receiver device 120 further comprises a data set detector 402 in charge of processing data sets received, in the scope of the powerline communications, via the phase to which the receiver device 120 is connected. In the first embodiment, the data set detector 402 is a beacon detector, adapted to process beacons received from the transmitter device 110 at a fixed frequency. In the second embodiment, the data set detector 402 is a frame detector, adapted to process frames received from the transmitter device 110 in a CSMA-CA manner. When a data set is received and when the data set comprises, at the predefined location PHASE, information representative of the phase to which the transmitter device 110 is connected, the data set detector 402 is adapted to trigger the time difference computing module 403. When a data set is received, the data set detector 402 is adapted to provide to a phase computing module 408 a value stored at the predefined location PHASE in the data set. As already explained with regard to FIG. 3, either said value is meaningless, or said value is representative of the phase to which the transmitter device 110 is connected.

The receiver device 120 further comprises the time difference computing module 403. The time difference computing module 403 is triggered by the data set detector 402 when a data set is received by the receiver device 120 and when the data set comprises, at the predefined location PHASE, information representative of the phase to which the transmitter device 110 is connected. The time difference computing module 403 is adapted to determine a time difference from the instant of the last detected zero-crossing and an instant at which the receiver device 120 started receiving the data set. Either it is considered that the time elapsed since the effective reception of the start of the data set is negligible, and then the time difference is the value provided by the timer ZC_RX 404; or it is considered that the time elapsed since the effective reception of the start of the data set is not negligible, and then the time difference is the value provided by the timer ZC_RX 404 minus a predefined duration of the data set, considering that the time difference computing module 403 is triggered by the data set detector 402 as soon as the data set is completely received.

According to one embodiment, the time difference computing module 403 is adapted to provide said time difference to an averaging module 407. According to another embodiment, the time difference computing module 403 is adapted to provide said time difference to the phase computing module 408.

Therefore, the receiver device 120 optionally further comprises the averaging module 407. The averaging module 407 is adapted to determine a smoothed time difference value, by averaging time difference values obtained on the basis of a predefined number of data sets for which the data set detector 402 triggered the time difference computing module 403. The averaging module 407 is adapted to provide the smoothed time difference value to the phase computing module 408.

The receiver device 120 further comprises the phase computing module 408. The phase computing module 408 is adapted to determine the phase to which the receiver device 120 is connected from the time difference value provided by the time difference computing module 403, or, when the averaging module 407 is implemented, from the smoothed time difference value provided by the averaging module 407. How the phase computing module 408 is adapted to determine the phase to which the receiver device 120 is connected is detailed hereafter with regard to FIG. 6.

According to one embodiment, the phase determined by the phase computing module 408 is considered as the phase to which the receiver device 120 is connected. According to another embodiment, the phase computing module 408 is adapted to provide information representative of said determined phase to a refreshing module 409, and the phase determined by the refreshing module 409 is considered as the phase to which the receiver device 120 is connected.

Therefore, the receiver device 120 optionally further comprises the refreshing module 409. The refreshing module 409 is adapted to cope with incorrect phase determination, for instance due to noise perturbing zero-crossing determination by the transmitter device 110 and/or by the receiver device 120. The refreshing module considers the phase information determined by the phase computing module 408 as temporary information.

According to one embodiment, the refreshing module 409 is adapted to determine the phase to which the receiver device 120 is connected as follows: when N successive determinations of the phase by the phase computing module 408 leads to a same result, with N>1, then the refreshing module 409 considers said result as being the phase to which the receiver device 120 is connected; otherwise, the refreshing module 409 considers the phase to which the receiver device 120 is connected as undetermined.

According to another embodiment, the refreshing module 409 is adapted to determine the phase to which the receiver device 120 is connected as follows: the refreshing module 409 considers that the phase to which the receiver device 120 is connected corresponds to the result represented the most among the last M successive determinations of the phase by the phase computing module 408, M>1; when no decision can be made, the refreshing module 409 considers the phase to which the receiver device 120 is connected as undetermined.

According to yet another embodiment, the refreshing module 409 is adapted to determine the phase to which the receiver device 120 is connected by inputting the phase determined by the phase computing module 408 in a low-pass filter defined as follows:

$$y_n = A \cdot P + (1-A) \cdot y_{n-1}$$

wherein:

A is a real number and A<1;

P is the phase provided by the phase computing module 408, represented by an index among the phases of the polyphase electric power supply network 100;

$y_n$ is the output of the n-th application of the low-pass filter.

The refreshing module 409 considers that the phase to which the receiver device 120 is connected corresponds to the rounded value of $y_n$ as follows:

$$P' = \mathrm{round}(y_n)$$

wherein P' is the phase determined by the refreshing module 409, represented by an index among the phases of the polyphase electric power supply network 100.

The block diagram of FIG. 4 is adapted to a receiver device having coupling interfaces for connecting the receiver device to one phase and the neutral wire, i.e. a single-phase receiver device. In case of a receiver device having coupling interfaces for connecting the receiver device to more than one phase and the neutral wire, i.e., a multi-phase receiver device, the block diagram of FIG. 4 is duplicated for each phase interface for which the receiver device shall determine to which phase said phase interface is connected.

FIG. 5 is a schematic diagram representing an algorithm performed by the transmitter device 110. The algorithm of FIG. 5 aims, for the transmitter device 110, at determining when the transmitter device 110 might include in a data set information representative of the phase to which the transmitter device 110 is connected.

In a step S501, the transmitter device 110 detects a zero-crossing with positive slope of the alternating electrical signal of the phase to which the transmitter device 110 is connected. In a variant, the transmitter device 110 detects a zero-crossing with negative slope of the alternating electrical signal of the phase to which the transmitter device 110 is connected.

In a step S502, upon detection of the zero-crossing, the transmitter device 110 resets and activates the timer ZC_TX. The timer ZC_TX is therefore representative of the period elapsed since the last zero-crossing detection, as performed in the step S501, on the phase to which the transmitter device 110 is connected.

In a step S503, the transmitter device 110 determines an instant at which the transmitter device 110 is expected to transmit a data set, as already described with regard to FIG. 3.

In a step S504, the transmitter device 110 determines whether the value of the timer ZC_TX, or the value that the timer ZC_TX would have, at the instant at which the transmitter device 110 is expected to transmit the data set is lower than the predetermined threshold ZC_TH. When the value of the timer ZC_TX is lower than the predetermined threshold ZC_TH, a step S505 is executed; otherwise, a step S506 is executed.

In the step S505, the transmitter device 110 includes in the beacon to be transmitted, at the predefined location PHASE, information representative of the phase to which the transmitter device 110 is connected. Then the transmitter device 110 transmits the data set at the expected instant and the algorithm ends.

In the step S506, the transmitter device 110 includes in the data set to be transmitted, at the predefined location PHASE, meaningless information. As already mentioned, meaningless information is a value that is not used to refer to a phase to which the transmitter device 110 can be connected. Then the transmitter device 110 transmits the beacon at the expected instant and the algorithm ends.

FIG. 6 is a schematic diagram representing an algorithm performed by the receiver device 110. The algorithm of FIG. 5 aims, for the transmitter device 120, at determining the phase to which the receiver device 120 is connected.

In a step S601, the receiver device 120 detects a zero-crossing with positive slope of the alternating electrical signal of the phase to which the receiver device 120 is connected. In a variant, the receiver device 120 detects a zero-crossing with negative slope of the alternating electrical signal of the phase to which the receiver device 120 is connected.

In a step S602, upon detection of the zero-crossing, the receiver device 120 resets and activates the timer ZC_RX. The timer ZC_RX is therefore representative of the time period elapsed since the last zero-crossing detection, as performed in the step S601, on the phase to which the receiver device 120 is connected.

In a step S603, the receiver device 120 determines an instant at which the receiver device 110 receives the start of a data set, and in a step S604, the receiver device 120 determines a time difference from the instant of the last detected zero-crossing and the instant at which the receiver device 120 started receiving the data set, as already described with regard to FIG. 4.

In a step S605, the receiver device 120 checks whether the received data set includes, at the predefined location PHASE, information representative of the phase to which the transmitter device 110 is connected. If the data set includes the information representative of the phase to which the transmitter device 110 is connected, a step S606 is executed; otherwise, a step S607 is optionally performed.

In the step S606, the receiver device 120 determines the phase to which the receiver device 120 is connected, on the basis of the time difference determined in the step S604 and the information representative of the phase to which the transmitter device 110 is connected included in the data set.

It shall therefore be noted that, in the particular embodiment wherein the location PHASE in the data set contains either meaningless information or information representative of the phase to which the transmitter device 110 is connected, a single piece of information provides the information representative of the phase to which the transmitter device 110 is connected and triggers determining the phase to which the receiver device 120 is connected. Indeed, when the location PHASE in the data set contains meaningless information, no determining of the phase to which the receiver device 120 is connected is triggered, and when the location PHASE in the data set does contain the information representative of the phase to which the transmitter device 110 is connected, determining of the phase to which the receiver device 120 is connected is triggered.

The latency between the instant of the last detected zero-crossing and the instant at which the receiver device 120 started receiving the data set depends on the angle difference between the phase to which the transmitter device 110 is connected and the phase to which the receiver device 120 is connected.

Considering that the polyphase electric power supply system 100 is direct, i.e. not inverse, the receiver device 120 compares the time difference determined in the step S603 with different values $V_k$ defined as follows:

$$V_k = \frac{k-1}{2F \cdot K}$$

wherein:
K is the number of phases of the polyphase electric power supply network 100;
F is the frequency of the alternating electrical signal transmitted via the phases, e.g. 50 Hz or 60 Hz;
k is an index of the phases of the polyphase electric power supply network 100, taking the values from 1 to K.

When the absolute difference between the time difference determined in the step S603 and one value V among the values $V_k$ is below a predefined threshold TH, the receiver device 120 is able to determine the phase P to which the receiver device 120 is connected, using the following formula:

$$P = ([PHASE] - k(V_k)) \% K + 1$$

wherein % represents the modulus operation and [PHASE] represents the information stored at the predefined location PHASE, presented as an index of the phases of the polyphase electric power supply network 100, similarly as k in the formula defining $V_k$, and $k(V_k)$ represents the value of k corresponding to the value V.

When the absolute difference between the time difference determined in the step S603 and any value V among the values $V_k$ is not below the predefined threshold TH, the receiver device 120 is unable to determine the phase to which the receiver device 120 is connected.

Let's consider the preferred embodiment in which the polyphase electric power supply network 100 is the electricity mains, the transmitter device 110 is a concentrator and the receiver device 120 is a meter installed at premises of a subscriber. Let's further consider that the frequency F of the alternating electrical signal is 50 Hz.

The receiver device 120 compares the time difference determined in the step S603 with the following set of values: $V_1=0$, $V_2=3.33$ ms, $V_3=6.66$ ms.

Therefore, considering that the transmitter device 110 is connected to the phase with index 1, meaning that the information at the location PHASE is represented by the binary value "01" and considering that the time difference determined in the step S603 matches the value $V_2$, it means that the receiver device 120 is connected to the phase with index $P=([1]-2)\%3+1=2+1=3$. Therefore the receiver device 120 is in this case connected to a phase shifted by +240 degrees compared to the phase to which the transmitter device 110 is connected.

In the step S606, averaging and/or refreshing operations may be performed, as already described with regard to FIG. 4. Once the step S606 is executed, the step S607 is optionally executed.

In the step S607, the receiver device 120 detects whether the receiver device is connected to the polyphase electric power supply network 100 in a phase reversal manner. Indeed, a phase connector of the receiver device 120 is expected to be connected to the phase, and a neutral connector of the receiver device 120 is expected to be connected to the neutral wire. It is however quite easy when installing the receiver device 120 to switch this wiring, which results in the phase connector being connected to the neutral wire. This wiring issue is called phase reversal. The step S607 aims at detecting phase reversal for receiver devices adapted to be connected to a single phase.

The formulas presented above assume that the transmitter device 110 and the receiver device 110 both perform zero-crossing detection on positive slope of the alternating electrical signal and on negative slope of the alternating electrical signal. For phase reversal detection, the transmitter device 110 and the receiver device 110 both perform zero-crossing detection only on positive slope of the alternating electrical signal or only on negative slope of the alternating electrical signal.

Still considering that the polyphase electric power supply system 100 is direct, i.e. not inverse, the receiver device 120 compares the time difference determined in the step S603 with different values $V''_k$ and $V'_k$ defined as follows:

$$V''_k = \frac{k-1}{F \cdot K}$$

$$V'_k = \frac{k-1}{F \cdot K} + \frac{1}{2K \cdot F}$$

When the absolute difference between the time difference determined in the step S603 and one value V" among the values $v''_k$ is below the predefined threshold TH, the receiver device 120 is able to determine the phase P to which the receiver device 120 is connected, using the following formula:

$$P=([PHASE]+k(V''_k)+1)\% K+1$$

wherein $k(V''_k)$ represents the value of k corresponding to the value V".

When the absolute difference between the time difference determined in the step S603 and one value V' among the values $V'_k$ is below the predefined threshold TH, the receiver device 120 is able to determine the phase P to which the receiver device 120 is connected, using the following formula:

$$P=([PHASE]+k(V'_k)+3)\% K+1$$

wherein $k(V'_k)$ represents the value of k corresponding to the value V'.

When the absolute difference between the time difference determined in the step S603 and any value V" among the values $V''_k$, or any value V' among the values $V'_k$, is not below the predefined threshold TH, the receiver is unable to determine the phase to which the receiver device 120 is connected.

Let's consider the preferred embodiment in which the polyphase electric power supply network 100 is the electricity mains, the transmitter device 110 is a concentrator and the receiver device 120 is a meter installed at premises of a subscriber. Let's further consider that the frequency F of the alternating electrical signal is 50 Hz.

The receiver device 120 compares the time difference determined in the step S603 with the following set of values: $V''_1=0$, $V''_2=6.66$ ms, $V''_3=13.33$ ms, $V'_1=3.33$ ms, $V'_2=10$ ms, $V'_3=16.66$ ms.

Therefore, considering that the transmitter device 110 is connected to the phase with index 1, meaning that the information at the location PHASE is represented by the binary value "01" and considering that the time difference determined in the step S603 matches the value $V'_2$, this means that the receiver device 120 is connected to the phase with index $P=([1]+2+3)\%3+1=0+1=1$. Therefore the receiver device 120 is, in this case, connected to a phase shifted by +240 degrees as compared to the phase to which the transmitter device 110 is connected, as already demonstrated in the example described above with regard to the values $V_k$, and the receiver device 120 is connected in a phase reversal manner.

Similar formulas as above can be derived by the one with ordinary skills in the art when considering that the polyphase electric power supply system 100 is inverse.

When the absolute difference between the time difference determined in the step S603 and one value V' among the values $V'_k$ is below the predefined threshold TH, the receiver device 120 detects that the receiver device 120 is connected to the polyphase electric power supply network 100 in a phase reversal manner. When the absolute difference between the time difference determined in the step S603 and one value V" among the values $V''_k$ is below the predefined threshold TH, the receiver device 120 detects that the receiver device 120 is correctly connected to the polyphase electric power supply network 100. Otherwise, the receiver device 120 is unable to determine whether or not the receiver device 120 is connected to the polyphase electric power supply network 100 in a phase reversal manner. It can therefore be noticed that the receiver device 120 is able to determine whether the receiver device 120 is connected in a phase reversal manner without knowing the phase to which the transmitter device 110 is connected. The receiver device 120 only needs an indication that the data set has been transmitted with a delay from the zero-crossing of the alternating signal on the phase to which the transmitter device is connected lower than the predefined threshold ZC_TH.

The algorithm of FIG. 6 is adapted to a single-phase receiver device, i.e. a receiver device having coupling interfaces for connecting the receiver device to one phase and the neutral. In case of a receiver device having coupling interfaces for connecting the receiver device to more than one phase and the neutral, i.e. a multi-phase receiver device, the block diagram of FIG. 6 is performed (except the step S607) for each phase interface for which the receiver device shall determine to which phase said phase interface is connected.

As already mentioned, in a preferred embodiment, the polyphase electric power supply network 100 is the electricity mains, the transmitter device 110 is a concentrator, and the receiver device 120 is a meter installed at premises of a subscriber. Once a meter is installed and connected to the mains, the phase to which the meter is installed is expected to remain stable, unless exceptional circumstances such as rewiring at substations. Consequently, the method described hereinbefore for determining the phase to which the receiver device 120 is connected may be performed only during installation of the meter or according to a rate lower than the rate at which a data set, such as beacon, transmission coincides with zero-crossing detection by the transmitter device 110.

The rate at which the data set transmission coincides with zero-crossing detection by the transmitter device 110 can be adjusted by adapting the value of the threshold ZC_TH. For instance, considering that the alternating electrical signal transmitted by the phases has a frequency that equals 50 Hz, considering that a beacon is transmitted every 618.24 ms (in the aforementioned PRIME draft specification, a beacon is transmitted with a periodicity of 276 symbols with a symbol duration of 2.24 ms), and considering that the transmitter device 110 and the receiver device 120 both perform zero-crossing detection on positive slope of the alternating electrical signal and on negative slope of the alternating electrical signal, setting the threshold ZC_TH to 1 ms means that 10% of the beacon transmissions coincides with zero-crossing detection by the transmitter device 110, and setting the threshold ZC_TH to 100 µs means that 1% of the beacon transmissions coincides with zero-crossing detection by the transmitter device 110. The value of the threshold ZC_TH should however remain low compared to the difference between consecutive aforementioned values $V_k$ in order to avoid false determinations of the phase by the receiver device 120.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A method for determining a phase to which a receiver device is connected in a polyphase electric power supply system, an alternating electrical signal being transmitted via phases of the polyphase electric power supply system, the polyphase electric power supply system being direct, a powerline communication being setup between a transmitter device and the receiver device via the polyphase electric power supply system,
   wherein the method comprises:
   detecting, by a processor of the transmitter device,
      a first zero-crossing with a positive slope of the alternating electrical signal and with a negative slope of the alternating electrical signal on a phase to which the transmitter device is connected;
   determining, by the processor of the transmitter device, an instant at which the transmitter device is expected to transmit a data set to the receiver device;
   determining, by the processor of the transmitter device, a first time difference from said first zero-crossing and said instant at which the transmitter device is expected to transmit the data set;
   including, by the processor of the transmitter device, in the data set to be transmitted information representative of the phase to which the transmitter device is connected only when said first time difference is below a first predefined threshold;
   transmitting, by the transmitter device, the data set to the receiver via the powerline communication;
   and wherein the method comprises:
   receiving, by the receiving device, the data set from the transmitter via the powerline communication;
   detecting, by a processor of the receiver device, a second zero-crossing with a positive slope of the alternating electrical signal and with a negative slope of the alternating electrical signal on a phase to which the receiver device is connected;
   determining, by the processor of the receiver device, an instant at which the receiver device receives the data set;
   determining, by the processor of the receiver device, a second time difference from said second zero-crossing and said instant at which the receiver device receives the data set;
   determining, by the processor of the receiver device, the phase to which the receiver device is connected, the determining comprising:
   comparing said second time difference with a set of values $V_k$ defined based on the number of phases K, the frequency of the alternating electrical signal F, and an index of the phases k taking the values from 1 to K;
   determining a value V among the values $V_k$ such that an absolute difference between said second time difference and said value V is below a second predefined threshold;
   determining a phase P to which the receiver device is connected based on the value of k corresponding to the value V and on said information representative of the phase to which the transmitter device is connected, presented as an index of the phases; and
   wherein the polyphase electric power supply system is an electricity mains, the transmitter device is a concentrator and the receiver device is a meter installed at premises of a subscriber.

2. A method for determining a phase to which a receiver device is connected in a polyphase electric power supply system, an alternating electrical signal being transmitted via phases of the polyphase electric power supply system, the polyphase electric power supply system being direct, a powerline communication being setup between a transmitter device and the receiver device via the polyphase electric power supply system, wherein the method comprises:

detecting, by a processor of the transmitter device, a first zero-crossing with a positive slope of the alternating electrical signal and with a negative slope of the alternating electrical signal on a phase to which the transmitter device is connected;

determining, by the processor of the transmitter device, an instant at which the transmitter device is expected to transmit a data set to the receiver device;

determining, by the processor of the transmitter device, a first time difference from said first zero-crossing and said instant at which the transmitter device is expected to transmit the data set;

including, by the processor of the transmitter device, in the data set to be transmitted information representative of the phase to which the transmitter device is connected only when said first time difference is below a first predefined threshold;

transmitting, by the transmitter device, the data set to the receiver via the powerline communication;

and wherein the method comprises:

receiving, by the receiving device, the data set from the transmitter via the powerline communication;

detecting, by a processor of the receiver device, a second zero-crossing with a positive slope of the alternating electrical signal and with a negative slope of the alternating electrical signal on a phase to which the receiver device is connected;

determining, by the processor of the receiver device, an instant at which the receiver device receives the data set;

determining, by the processor of the receiver device, a second time difference from said second zero-crossing and said instant at which the receiver device receives the data set;

determining, by the processor of the receiver device, the phase to which the receiver device is connected, the determining comprising:

comparing said second time difference with a set of values $V_k$ defined based on the number of phases K, the frequency of the alternating electrical signal F, and an index of the phases k taking the values from 1 to K;

determining a value V among the values $V_k$ such that an absolute difference between said second time difference and said value V is below a second predefined threshold;

determining a phase P to which the receiver device is connected based on the value of k corresponding to the value V and on said information representative of the phase to which the transmitter device is connected, presented as an index of the phases; and wherein the alternating electrical signal is transmitted via the phases of the polyphase electric power supply system at a first frequency, the transmitter device transmitting powerline communication beacons to the receiver device at a second frequency different from the first frequency, the first and second frequencies not being a multiple of each other, said data set is one of said beacons.

3. The method according to claim 2, wherein the powerline communication is setup according to the PRIME specification.

4. A method for determining a phase to which a receiver device is connected in a polyphase electric power supply system, an alternating electrical signal being transmitted via phases of the polyphase electric power supply system, the polyphase electric power supply system being direct, a powerline communication being setup between a transmitter device and the receiver device via the polyphase electric power supply system, wherein the method comprises:

detecting, by a processor of the transmitter device, a first zero-crossing with a positive slope of the alternating electrical signal and with a negative slope of the alternating electrical signal on a phase to which the transmitter device is connected;

determining, by the processor of the transmitter device, an instant at which the transmitter device is expected to transmit a data set to the receiver device;

determining, by the processor of the transmitter device, a first time difference from said first zero-crossing and said instant at which the transmitter device is expected to transmit the data set;

including, by the processor of the transmitter device, in the data set to be transmitted information representative of the phase to which the transmitter device is connected only when said first time difference is below a first predefined threshold;

transmitting, by the transmitter device, the data set to the receiver via the powerline communication;

and wherein the method comprises:

receiving, by the receiving device, the data set from the transmitter via the powerline communication;

detecting, by a processor of the receiver device, a second zero-crossing with a positive slope of the alternating electrical signal and with a negative slope of the alternating electrical signal on a phase to which the receiver device is connected;

determining, by the processor of the receiver device, an instant at which the receiver device receives the data set;

determining, by the processor of the receiver device, a second time difference from said second zero-crossing and said instant at which the receiver device receives the data set;

determining, by the processor of the receiver device, the phase to which the receiver device is connected, the determining comprising:

comparing said second time difference with a set of values $V_k$ defined based on the number of phases K, the frequency of the alternating electrical signal F, and an index of the phases k taking the values from 1 to K;

determining a value V among the values $V_k$ such that an absolute difference between said second time difference and said value V is below a second predefined threshold;

determining a phase P to which the receiver device is connected based on the value of k corresponding to the value V and on said information representative of the phase to which the transmitter device is connected, presented as an index of the phases;

and wherein the transmitter device transmits powerline communication frames in a Carrier Sense Multiple Access with Collision Avoidance manner, said data set being one of said frames.

5. The method according to claim 4, wherein the powerline communication is setup according to a G3-PLC specification.

6. The method according to claim 1, wherein the receiver device performs
- detecting whether the received data set includes information representative of the phase to which the transmitter device is connected; and
- the determining of the phase to which the receiver device is connected is performed when the receiver device detects that said information representative of the phase to which the transmitter device is connected is included in the received data set.

7. The method according to claim 1, wherein in the data set to be transmitted, information is included at a predefined location in the data set which is representative of the phase to which the transmitter device is connected is performed,
- and wherein when said first time difference is not below the first predefined threshold, the transmitter device includes in the data set to be transmitted meaningless information at said predefined location.

8. The method according to claim 1, wherein the receiver device performs:
- determining said second time difference for plural received data sets that have information representative of the phase to which the transmitter device is connected;
- averaging said second time difference over said plural received data sets;
- and determining the phase to which the receiver device is connected, on the basis of the averaged second time difference and of said information representative of the phase to which the transmitter device is connected.

9. The method according to claim 1, wherein the receiver device further performs:
- determining phase temporary information, representing the phase to which the receiver device is supposed to be connected, for each data set of a plurality received data sets, on the basis of said second time difference determined for said data set and of said information representative of the phase to which the transmitter device is connected being included in said data set;
- considering that the phase to which the receiver device is connected relates to the phase temporary information that coincides for N consecutive data sets, wherein N>1.

10. The method according to claim 1, wherein the receiver device performs:
- determining phase temporary information, representing the phase to which the receiver device is supposed to be connected, for each data set of a plurality received data sets, on the basis of said second time difference determined for said data set and of said information representative of the phase to which the transmitter device is connected being included in said data set;
- considering that the phase to which the receiver device is connected relates to the phase temporary information represented the most among M consecutive data sets, wherein M>1.

11. A method for determining a phase to which a receiver device is connected in a polyphase electric power supply system, an alternating electrical signal being transmitted via phases of the polyphase electric power supply system, the polyphase electric power supply system being direct, a powerline communication being setup between a transmitter device and the receiver device via the polyphase electric power supply system, wherein the method comprises:
- detecting, by a processor of the transmitter device, a first zero-crossing with a positive slope of the alternating electrical signal and with a negative slope of the alternating electrical signal on a phase to which the transmitter device is connected;
- determining, by the processor of the transmitter device, an instant at which the transmitter device is expected to transmit a data set to the receiver device;
- determining, by the processor of the transmitter device, a first time difference from said first zero-crossing and said instant at which the transmitter device is expected to transmit the data set;
- including, by the processor of the transmitter device, in the data set to be transmitted information representative of the phase to which the transmitter device is connected only when said first time difference is below a first predefined threshold;
- transmitting, by the transmitter device, the data set to the receiver via the powerline communication;

and wherein the method comprises:
- receiving, by the receiving device, the data set from the transmitter via the powerline communication;
- detecting, by a processor of the receiver device, a second zero-crossing with a positive slope of the alternating electrical signal and with a negative slope of the alternating electrical signal on a phase to which the receiver device is connected;
- determining, by the processor of the receiver device, an instant at which the receiver device receives the data set;
- determining, by the processor of the receiver device, a second time difference from said second zero-crossing and said instant at which the receiver device receives the data set;
- determining, by the processor of the receiver device, the phase to which the receiver device is connected, the determining comprising:
- comparing said second time difference with a set of values $V_k$ defined based on the number of phases K, the frequency of the alternating electrical signal F, and an index of the phases k taking the values from 1 to K;
- determining a value V among the values $V_k$ such that an absolute difference between said second time difference and said value V is below a second predefined threshold;
- determining a phase P to which the receiver device is connected based on the value of k corresponding to the value V and on said information representative of the phase to which the transmitter device is connected, presented as an index of the phases; and wherein the receiver device performs:
- determining phase temporary information, representing the phase to which the receiver device is supposed to be connected, for each data set of a plurality received data sets, on the basis of said second time difference determined for said data set and of said information representative of the phase to which the transmitter device is connected being included in said data set;
- inputting the phase temporary information in a low-pass filter; and
- considering that the phase to which the receiver device is connected is a rounded output of the low-pass filter.

12. The method according to claim 1,
wherein a set of values $V_k$ are defined as follows:

$$V_k = \frac{k-1}{x \cdot F \cdot K}$$

wherein K is the number of phases, F is the frequency of the alternating electrical signal, and k is an index of the phases taking the values from 1 to K, wherein said determining the phase to which the receiver device is connected is performed as follows:

$$P=([PHASE]-k(V_k)+y)\% K+1$$

wherein $k(V_k)$ represents the value of k corresponding to the value V, and [PHASE] represents said information representative of the phase to which the transmitter device is connected, presented as an index of the phases, wherein x=1 and y=1, and wherein the receiver device performs:

comparing said second time difference with the set of values $V_k$ and a second set of values $V'_k$ defined as follows:

$$V'_k = \frac{k-1}{F \cdot K} + \frac{1}{2K \cdot F};$$

determining the value V among the values $V_k$ or a value V' among the values $V'_k$ such that the absolute difference between said second time difference and said value V or respectively said value V' is below a second predefined threshold;

determining the phase P to which the receiver device is connected as follows, according to whether the value V or the value V' is determined:

$$P=([PHASE]+k(V_k)+y)\% K+1$$

$$P=([PHASE]+k(V'_k)+3)\% K+1$$

wherein $k(V'_k)$ represents the value of k corresponding to the value V'.

13. The method according to claim 12, wherein the receiver device being a single-phase receiver device, when the receiver device determines a value V' among the values $V'_k$ such that the absolute difference between said second time difference and said value V' is below the second predefined threshold, the receiver device considers being connected in a phase reversal manner.

14. A system for determining a phase to which a receiver device is connected in a polyphase electric power supply system, the polyphase electric power supply system being direct, the system comprising:

a transmitter device and the receiver device, an alternating electrical signal being transmitted via phases of the polyphase electric power supply system, a powerline communication being setup between the transmitter device and the receiver device via the polyphase electric power supply system, wherein the transmitter device comprises a processor causing the transmitter device to implement:

a first zero crossing detector for detecting a first zero-crossing with a positive slope of the alternating electrical signal and with a negative slope of the alternating electrical signal on a phase to which the transmitter device is connected;

a first timer for determining an instant at which the transmitter device is expected to transmit a data set to the receiver device;

a comparator for determining a first time difference from said first zero-crossing and said instant at which the transmitter device is expected to transmit the data set;

a dataset generator for including in the data set to be transmitted information representative of the phase to which the transmitter device is connected, only when said first time difference is below a first predefined threshold;

the transmitter device further comprising circuitry for transmitting the data set to the receiver device via the powerline communication;

the receiver device comprising circuitry for receiving the data set from the transmitter device via the powerline communication;

the receiver device further comprising a processor causing the receiver device to implement:

a second zero crossing detector for detecting a second zero-crossing with a positive slope of the alternating electrical signal and with a negative slope of the alternating electrical signal on a phase to which the receiver device is connected;

a second timer for determining an instant at which the receiver device receives the data set;

a time difference computing module for determining a second time difference from said second zero-crossing and said instant at which the receiver device receives the data set;

a phase computing module being adapted for:

comparing said second time difference with a set of values $V_k$ defined based on the number of phases K, the frequency of the alternating electrical signal F, and an index of the phases k taking the values from 1 to K;

determining a value V among the values $V_k$ such that an absolute difference between said second time difference and said value V is below a second predefined threshold;

determining a phase to which the receiver device is connected based on a value $k(V_k)$ of k corresponding to the value V and on said information representative of the phase to which the transmitter device is connected, presented as an index of the phases; and wherein the polyphase electric power supply system is an electricity mains, the transmitter device is a concentrator and the receiver device is a meter installed at premises of a subscriber.

15. Non-transitory information storage medium, storing a computer program comprising program code instructions which can be loaded in a programmable device to cause said programmable device to implement the method according to claim 1, when the program code instructions are run by the programmable device.

16. A method for determining a phase to which a receiver device is connected in a polyphase electric power supply system, an alternating electrical signal being transmitted via phases of the polyphase electric power supply system, the polyphase electric power supply system being direct, a powerline communication being setup between a transmitter device and the receiver device via the polyphase electric power supply system, wherein the method comprises:

detecting, by a processor of the transmitter device, a first zero-crossing with a positive slope of the alternating electrical signal and with a negative slope of the alternating electrical signal on a phase to which the transmitter device is connected;

determining, by the processor of the transmitter device, an instant at which the transmitter device is expected to transmit a data set to the receiver device;

determining, by the processor of the transmitter device, a first time difference from said first zero-crossing and said instant at which the transmitter device is expected to transmit the data set;

including, by the processor of the transmitter device, in the data set to be transmitted information representative of the phase to which the transmitter device is connected only when said first time difference is below a first predefined threshold;

transmitting, by the transmitter device, the data set to the receiver via the powerline communication;

and wherein the method comprises:

receiving, by the receiving device, the data set from the transmitter via the powerline communication;

detecting, by a processor of the receiver device, a second zero-crossing with a positive slope of the alternating electrical signal and with a negative slope of the alternating electrical signal on a phase to which the receiver device is connected;

determining, by the processor of the receiver device, an instant at which the receiver device receives the data set;

determining, by the processor of the receiver device, a second time difference from said second zero-crossing and said instant at which the receiver device receives the data set;

determining, by the processor of the receiver device, the phase to which the receiver device is connected, the determining comprising:

comparing said second time difference with a set of values $V_k$ defined based on the number of phases K, the frequency of the alternating electrical signal F, and an index of the phases k taking the values from 1 to K;

determining a value V among the values $V_k$ such that an absolute difference between said second time difference and said value V is below a second predefined threshold; and determining a phase P to which the receiver device is connected based on the value of k corresponding to the value V and on said information representative of the phase to which the transmitter device is connected, presented as an index of the phases.

* * * * *